(12) United States Patent
Yanagawa et al.

(10) Patent No.: US 9,287,187 B2
(45) Date of Patent: Mar. 15, 2016

(54) POWER SEMICONDUCTOR MODULE

(75) Inventors: Katsuhiko Yanagawa, Hino (JP); Yoshinari Ikeda, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 13 days.

(21) Appl. No.: 14/125,019

(22) PCT Filed: Apr. 16, 2012

(86) PCT No.: PCT/JP2012/060278
§ 371 (c)(1),
(2), (4) Date: Dec. 30, 2013

(87) PCT Pub. No.: WO2012/172862
PCT Pub. Date: Dec. 20, 2012

(65) Prior Publication Data
US 2014/0124936 A1 May 8, 2014

(30) Foreign Application Priority Data
Jun. 16, 2011 (JP) ................................ 2011-134211

(51) Int. Cl.
| | |
|---|---|
| H01L 23/48 | (2006.01) |
| H01L 23/52 | (2006.01) |
| H01L 29/40 | (2006.01) |
| H01L 23/08 | (2006.01) |
| H01L 25/07 | (2006.01) |
| H01L 23/31 | (2006.01) |

(Continued)

(52) U.S. Cl.
CPC .............. *H01L 23/08* (2013.01); *H01L 21/565* (2013.01); *H01L 23/29* (2013.01); *H01L 23/3135* (2013.01); *H01L 25/07* (2013.01); *H01L 25/072* (2013.01); *H01L 25/18* (2013.01); *H01L 21/561* (2013.01); *H01L 23/053* (2013.01); *H01L 25/162* (2013.01); *H01L 2924/0002* (2013.01)

(58) Field of Classification Search
CPC ....... H01L 23/08; H01L 21/565; H01L 23/29; H01L 25/18; H01L 25/07; H01L 23/3135; H01L 25/072; H01L 21/561; H01L 2924/0002; H01L 23/053; H01L 25/162
See application file for complete search history.

(56) References Cited

FOREIGN PATENT DOCUMENTS

| | | |
|---|---|---|
| JP | H04206651 A | 7/1992 |
| JP | 2003082241 A | 3/2003 |

(Continued)

OTHER PUBLICATIONS

International Search Report for PCT/JP2012/060278, Jul. 24, 2012.

*Primary Examiner* — Jarrett Stark
(74) *Attorney, Agent, or Firm* — Manabu Kanesaka

(57) ABSTRACT

A power semiconductor module has an insulating layer; a copper base substrate having first and second copper blocks, either the first or the second copper block being fixed on one side and the other being fixed on the other side of the insulating layer; a plurality of power semiconductor elements using silicon carbide, and having one side fixed onto the first copper block with a conductive bond layer; a plurality of implant pins fixed to the other side of each of the plurality of power semiconductor elements with a conductive bond layer; a printed circuit board fixed to the implant pins and disposed to face the power semiconductor elements; a first sealing material containing no flame retardant, and disposed at least between the power semiconductor elements and the printed circuit board; and a second sealing material containing a flame retardant, and disposed to cover the first sealing material.

1 Claim, 1 Drawing Sheet

(51) Int. Cl.
*H01L 23/29* (2006.01)
*H01L 25/18* (2006.01)
*H01L 21/56* (2006.01)
*H01L 25/16* (2006.01)
*H01L 23/053* (2006.01)

(56) References Cited

FOREIGN PATENT DOCUMENTS

| | | |
|---|---|---|
| JP | 2007116172 A | 5/2007 |
| JP | 2009064852 A | 3/2009 |
| JP | 2010219420 A | 9/2010 |

POWER SEMICONDUCTOR MODULE

RELATED APPLICATIONS

The present application is National Phase of International Application No. PCT/JP2012/060278 filed Apr. 16, 2012, and claims priority from Japanese Application No. 2011-134211 filed Jun. 16, 2011.

TECHNICAL FIELD

The present invention relates to a sealing structure for a power semiconductor module, and particularly to a power semiconductor module using silicon.

BACKGROUND ART

FIG. 2 shows a cross-sectional structure diagram of a conventional power semiconductor module. In this power semiconductor module 200, silicon power semiconductor elements 25 are soldered to a copper base substrate 23 with a solder layer 24a therebetween, the copper base substrate 23 having an insulating layer 21 and a circuit pattern 22. Then, a lead frame 27 is soldered to this structure with a solder layer 26b therebetween, and an external connection terminal 28 is connected thereto.

The number of silicon power semiconductor elements 25 mounted in the power semiconductor module 200 is determined based on the volume of the power semiconductor module 200. The silicon power semiconductor elements 25 are attached to the copper base substrate 23, the size of which is determined in accordance with this volume.

Then, a case 29 is attached to this structure, and a joint portion between the case 29 and the copper base substrate 23 is sealed with an adhesive (not shown). Subsequently, a sealing material layer 30 is placed in this structure. Silicone gel, a two-pack mixing type reaction material, is used as the sealing material layer 30. A predetermined amount of silicone sealing material layer 30. A predetermined amount of silicone gel is measured, mixed/stirred, primarily degassed for 10 minutes in a 13.33 Pa (0.1 Torr) vacuum environment, and then poured into the case 29. The resultant material is secondarily degassed for 10 minutes in a 13.33 Pa vacuum environment, and heated and cured at 120° C. for two hours, and then a lid 31 is placed onto the case 29, thereby completing the power semiconductor module 200.

When used, the power semiconductor module 200 is attached to a cooling fin applied with a thermal conduction paste.

When operating the power semiconductor module 200, it is important to transfer heat of the power semiconductor elements 25 from the copper base substrate 23 to the cooling fin via a thermal conduction paste 12, due to large current flowing through the power semiconductor elements 25 and the circuit pattern 22.

Patent Document 1: Japanese Patent Application Publication No. 2007-116172

Due to the better electrical characteristics of silicon carbide than silicon, the material of a power semiconductor element is expected to be changed from silicon to silicon carbide in the future. A power semiconductor element made of silicon carbide exerts its operating characteristics at high temperature which are better than the operating characteristics of a power semiconductor element made of silicon. Therefore, the power semiconductor element made of silicon carbide generates a high current density.

However, when a current of high density flows through a power semiconductor element, the amount of heat generated increases, resulting in an increase in the temperature of a sealing material in the vicinity of the element, the sealing material being used for sealing the power semiconductor element. When the power semiconductor element is made of silicon carbide in place of silicon, the temperature of the element reaches approximately 200° C. On the other hand, the temperature of an outer circumference of the power semiconductor module tends to become lower than that of the vicinity of the element.

Therefore it is important that the sealing material disposed in the vicinity of the element be resistant to heat, and it is also important to employ a sealing material that implements stable operation at high temperature.

A sealing material of a power semiconductor module having a silicon carbide element is added with aluminum hydroxide or the like as a flame retardant in order to deal with non-halogenation. Unfortunately, the problem in such a case is that the sealing material thermally deteriorates due to the flame retardant, lowering the thermal resistant performance of the power semiconductor module.

DISCLOSURE OF THE INVENTION

In order to solve these problems, an object of the present invention is to provide a power semiconductor module using a sealing material suitable for the temperature of the vicinity of a silicon carbide element of the power semiconductor module and the temperature of an outer circumference of the power semiconductor module.

According to the present invention, the object is achieved by a power semiconductor module having an insulating layer; a copper base substrate having a first copper block and a second copper block, either the first or second copper block being fixed on one side and the other being fixed on the other side of the insulating layer; a plurality of power semiconductor elements using silicon carbide, each having one side fixed onto the first copper block with a conductive bond layer; a plurality of implant pins fixed to the other side of each of the plurality of power semiconductor elements with a conductive bond layer; a printed circuit board fixed to the implant pins and disposed to face the power semiconductor elements; a first sealing material containing no flame retardant and disposed at least between the power semiconductor elements and the printed circuit board; and a second sealing material containing a flame retardant and disposed to cover the first sealing material.

The conductive bond layers are used to fix the power semiconductor elements to the copper base substrate and to fix the power semiconductor elements to the plurality of implant pins.

It is preferred that a heat distortion temperature of the first sealing material is 175° C. to 225° C.

It is preferred that a thermal expansion coefficient of the first sealing material is $1.5 \times 10^{-5}/°$ C. to $1.8 \times 10^{-5}/°$ C.

It is preferred that a bonding strength of the first sealing material to the copper base substrate is 10 MPa to 30 MPa.

It is preferred that a heat distortion temperature of the second sealing material is 100° C. to 175° C.

It is preferred that a thermal expansion coefficient of the second sealing material is $1.5 \times 10^{-5}/°$ C. to $1.8 \times 10^{-5}/°$ C.

It is preferred that a bonding strength of the second sealing material to the copper base substrate is 10 MPa to 30 MPa.

It is preferred that liquid epoxy resin is used in the first sealing material and the second sealing material.

A method for manufacturing a power semiconductor module according to the present invention has a step of preparing an insulating layer; a step of preparing a copper base substrate having a first copper block and a second copper block on either one side with the insulating layer or the other side; a step of fixing one side of a plurality of power semiconductor elements using silicon carbide on the first copper block with a conductive bond layer; a step of fixing a plurality of implant pins to each of the other sides of the plurality of power semiconductor elements with a conductive bond layer; a step of fixing a printed circuit board to the implant pins so that the printed circuit board is disposed to face the power semiconductor elements; a step of filling a first sealing material containing no flame retardant into at least between the power semiconductor elements and the printed circuit board; and a step of disposing a second sealing material containing a flame retardant to cover the first sealing material.

The present invention in which the above-described configuration is used can provide a highly reliable power semiconductor module that can prevent a heat exhaustion-induced increase in thermal resistance of the conductive bond layers disposed above and below the power semiconductor elements.

The use of a sealing material without a flame retardant as the first sealing material can improve thermal resistant performance of the power semiconductor module. The use of a sealing material with a flame retardant as the second sealing material lowers the thermal resistant performance of the power semiconductor module compared to a sealing material without a flame retardant, but does not generate any problems in the power semiconductor module because the temperature of the second sealing material is lower than that of the vicinity of the elements of the power semiconductor module.

BEST MODE FOR CARRYING OUT THE INVENTION

An embodiment of the present invention is described hereinafter in detail using an example illustrated in FIG. 1.

Embodiment

Figure 1:
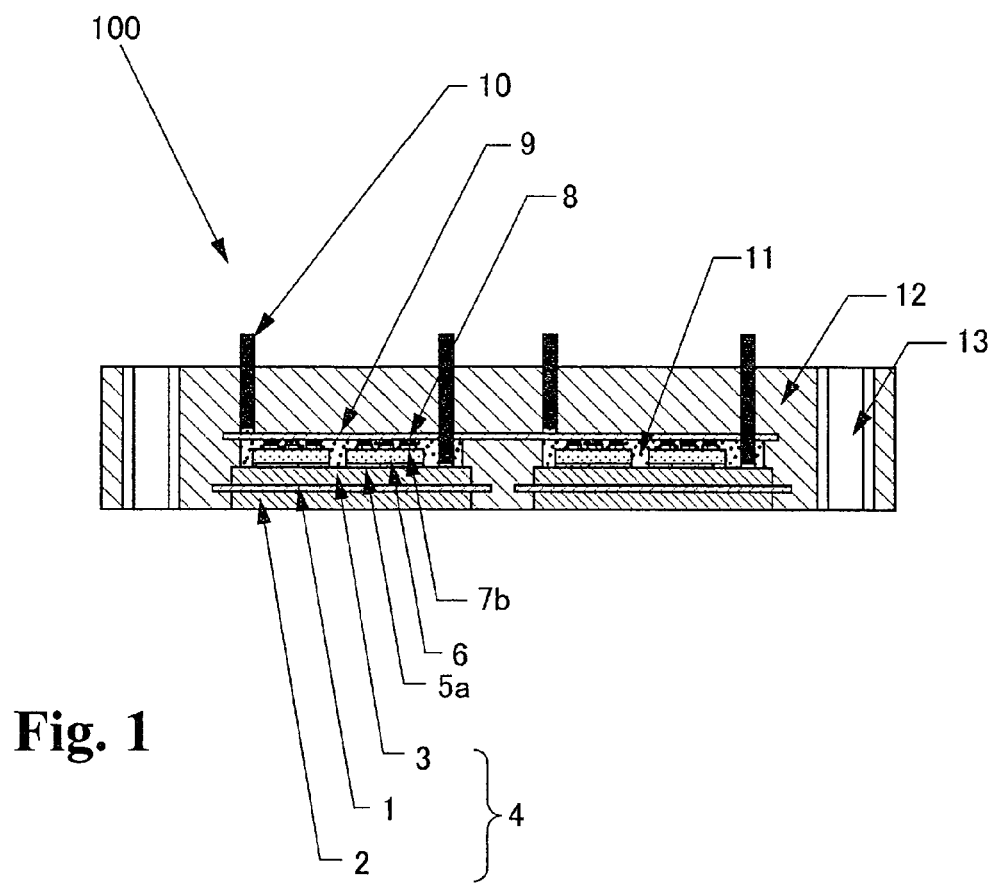
FIG. 1 is a cross-sectional structure diagram showing a molded structure of a silicon carbide power semiconductor module according to an embodiment of the present invention.
Figure 2:
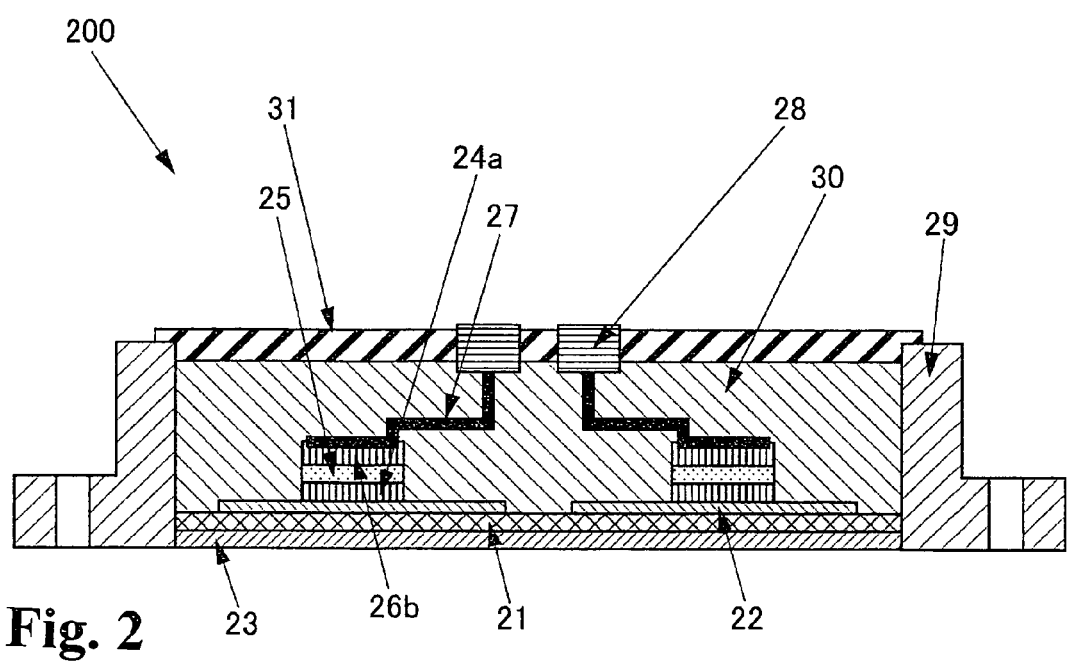
FIG. 2 is a cross-sectional structure diagram of the conventional silicon power semiconductor module.

FIG. 1 is a cross-sectional structure diagram showing a molded structure of a silicon carbide power semiconductor module according to the embodiment of the present invention.

A method for manufacturing the molded structure of the silicon carbide power semiconductor module is described with reference to FIG. 1.

Copper blocks 2 and 3 are disposed respectively on both sides of an insulating layer 1 to configure a copper base substrate 4. A plurality of silicon carbide power semiconductor elements 6 is mounted on an upper surface of this copper base substrate 4, with a conductive bond layer 5a therebetween. Then, an implant-type printed board 9 with implant pins 8 is attached to upper surfaces of the silicon carbide power semiconductor elements 6, with conductive bond layers 7b therebetween.

The implant pins 8 are now described. Each implant pin 8 is, for example, 120 μm in diameter and 300 μm in length. Approximately a maximum of eleven implant pins 8 are disposed on each of the power semiconductor elements 6.

The implant pins 8 are fixed to conductive patterns of the printed circuit board 9, which are not shown. The printed circuit board 9 and the copper block 3 are spaced apart from each other by approximately 1 mm, with the narrowest gap therebetween being approximately 200 μm. The printed circuit board 9 is made of, for example, an epoxy resin or polyimide resin.

Additionally, external connection terminals 10 are attached to the resultant configuration described above, and a first sealing material 11 is injected into the vicinity of each silicon carbide power semiconductor element 6 between the copper base substrate 4 and the implant-type printed board 9 by using a dispenser. Then, the obtained structure is placed in a mold, not shown, and sealed with a second sealing material 12, thereby completing a silicon carbide power semiconductor module molded structure 100.

In a method for injecting the first sealing material 11 in the silicon carbide power semiconductor module molded structure 100, a dispenser is used to inject the first sealing material 11 into a position near each silicon carbide power semiconductor element 6 between the copper base substrate 4 and the implant-type printed board 9.

The first sealing material 11 is in the form of liquid with no flame retardant made of a one-pack liquid molding and sealing material obtained by adding a 85 wt % silica filler to a mixed composition of cycloaliphatic epoxy resin and acid anhydride curing agent.

The first sealing material 11 is cured for one hour at 100° C.

The physical properties of the cured first sealing material 11 are as follows: the first sealing material 11 has a heat distortion temperature of 225° C., a thermal expansion coefficient of $1.5\times10^{-5}$/° C., and a bonding strength of 23 MPa to the copper base substrate 4.

The physical properties of the first sealing material 11 are now described.

When the heat distortion temperature of the first sealing material 11 is 175° C. to 225° C., the inflection point in relation to the thermal properties of the sealing material 11 increases, preventing an increase of the thermal resistance from the heat exhaustion of the conductive bond layers 5a, 7b disposed below and above the power semiconductor elements 6. Therefore, highly reliable power semiconductor module with high thermal resistant performance can be obtained. Because the temperature of the power semiconductor elements can reach approximately 200° C., the heat distortion temperature of the sealing material 11 needs to be at least 175° C. The upper limit of the heat distortion temperature of the first sealing material 11 is set at 225° C. with leeway.

The thermal expansion coefficient of the sealing material 11 is equivalent to that of a copper. Therefore, warpage of the copper base substrate 4 having the insulating layer 1 and the copper blocks 2, 3 can be prevented, as well as an increase of the thermal resistance from the heat exhaustion of the conductive bond layers 5a, 7b disposed below and above the power semiconductor elements 6, providing a highly reliable power semiconductor module.

In addition, because the sealing material 11 is adhered to the copper blocks 2, 3 with a bonding strength of 10 MPa to 30 MPa, the power semiconductor elements 6 can be adhered strongly to the copper base substrate 4. This can prevent an increase of the thermal resistance of the conductive bond layers 5a and 7b disposed below and above the power semiconductor elements 6, providing a highly reliable power semiconductor module. Thus, it was confirmed in load tests such as a power cycle test and a heat shock test that the power semiconductor module of the present invention is highly reliable. In the heat shock test, it is less likely that warpage of the copper base substrate 4 and the thermal resistance of the power semiconductor module increase as the number of cycles increase.

When sealing the silicon carbide power module molded structure 100 with the second sealing material 12, the silicon carbide power semiconductor module molded structure 100 is stored in a cavity formed by male and female liquid transfer molds (not shown), wherein molding temperature is increased to 160° C. to keep the heat therein. The male and female transfer molds are provided with a pot portion and runner portion of the second sealing material 12. Note that the cavity, the pot portion, and the runner portion mean respectively a pot for storing resin, a cavity in which the power semiconductor elements 6 to be resin-sealed are stored, and a runner through which the resin stored in the pot is guided to the cavity.

The second sealing material 12 is a one-pack liquid molding and sealing material obtained by adding a 85 wt % silica filler and aluminum hydroxide as a flame retardant into a mixed composition of cycloaliphatic epoxy resin and acid anhydride curing agent.

The physical properties of the second sealing material 12 after being cured are as follows: the second sealing material 12 has a heat distortion temperature of 175° C., a thermal expansion coefficient of $1.5 \times 10^{-5}/°$ C., and a bonding strength of 20 MPa to adhere to the first sealing material.

The physical properties of the second sealing material 12 are basically the same as those of the first sealing material 11.

Because the temperature of the power semiconductor elements 6 can be approximately 200° C., making the vicinity of these elements hot, the heat distortion temperature of the second sealing material 12 needs to be approximately the same as that of the first sealing material 11. However, the second sealing material 12 is not required to have a significantly high thermal resistant performance because sections outside the elements do not get as hot. Therefore, a relatively inexpensive sealing material can be used as the second sealing material 12. Because the temperature of the power semiconductor elements 6 can reach approximately 200° C., the upper limit of the heat distortion temperature of the sealing material 12 is set at 175° C., which is the lower limit of the heat distortion temperature of the sealing material 11. The lower limit of the heat distortion temperature of the sealing material 12 is set at 100° C. because it is less likely that heat spreads to the sealing material 12.

The thermal expansion coefficient of the sealing material 12 is equivalent to that of copper. Thus, because the thermal expansion coefficient of the second sealing material 12 is equivalent to that of the first sealing material 11, non-uniform stress is prevented from acting on the entire module, and the module react evenly.

The bonding strength of the second sealing material 12 is substantially equivalent to that of the first sealing material. A bonding strength of 30 MPa or higher is the maximum bonding strength of the sealing material. However, a bonding strength of 10 MPa or less is weak to adhere the sealing material to the copper leading to peeling of the sealing material, and the strength to guard the elements will be gone.

In a transfer molding method using the liquid sealing material, a one-pack liquid molding and sealing material composed of cycloaliphatic epoxy resin and acid anhydride curing agent is primarily degassed beforehand for 10 minutes in a 13.33 Pa vacuum environment and then poured into a cylinder container. Subsequently, a required amount of this material is poured from the cylinder container into the pot portion of the male and female molds. Then, the male and female molds are clamped to press-fit the molding and sealing material into the mold cavity from the pot portion through the runner portion, thereby completing molding of a silicon carbide power semiconductor module. The silicon carbide power semiconductor module is molded under the following conditions: the mold clamping pressure is 150 kg/cm$^2$ (14.7 MPa), and the material is formed into a gel at 160° C. for one minute and then cured for three minutes.

Because liquid epoxy resin is added to the liquid sealing material, the second sealing material 12 can be poured in an outer circumferential part of the first sealing material 11 that is injected and cured beforehand between the copper base substrate 4 and the implant-type printed board 9, and at the same time the molding process can be completed within a short period of time, providing a highly productive and reliable power semiconductor module.

Moreover, the first sealing material 11 is unlikely to deteriorate by oxidation because it is disposed in the vicinity of the elements without directly contacting the air. In view of this fact, the thermal resistant performance of the power semiconductor module can be enhanced by using a sealing material that does not have a flame retardant. On the other hand, the second sealing material 12 directly contacts the air in an outer circumference of the power semiconductor module. Thus, addition of a flame retardant can make the second sealing material 12 more resistant to oxidation degradation.

EXPLANATION OF REFERENCE NUMERALS

1 Insulating layer
2 Copper block
3 Copper block
4 Copper base substrate
5a Conductive bond layer
6 Carbonized silicon semiconductor element
7b Conductive bond layer
8 Implant pin
9 Implant-type printed board
10 External terminal
11 First sealing material
12 Second sealing material
13 Clamp
100 Carbonized silicon semiconductor power module molded structure
21 Insulating layer
22 Circuit pattern
23 Copper base substrate
24a Solder layer
25 Silicon power semiconductor element
26b Solder layer
27 Lead frame
28 External connection terminal
29 Case
30 Sealing material
31 Lid
200 Silicon power semiconductor module structure

What is claimed is:
1. A semiconductor power module molded structure, comprising:
  a case; and
  a plurality of power semiconductor modules in the case, each of the power semiconductor modules comprising:
  one insulating layer, a copper base substrate having a first copper block and a second copper block, either the first or second copper block being fixed on one side of the one insulating layer and the other being fixed on the other side of the one insulating layer;

a plurality of power semiconductor elements having silicon carbide and formed on the copper base substrate, each having one side fixed onto the first copper block with a first conductive bond layer;

a plurality of implant pins fixed to the other side of each of the plurality of power semiconductor elements with a second conductive bond layer;

a printed circuit board fixed to the plurality of implant pins and disposed to face the plurality of power semiconductor elements;

a first sealing material containing no flame retardant, and disposed only at a portion where the plurality of power semiconductor elements is enclosed, the first sealing material covering an upper portion and side portions of each of the plurality of power semiconductor elements between the copper base substrate and the printed circuit board;

a second sealing material containing a flame retardant, and disposed to cover the first sealing material; and an external connection terminal extending upwardly from the copper base substrate to cross the printed circuit board, wherein said plurality of power semiconductor elements is disposed on the one insulating layer with a space therebetween, only the first sealing material being disposed in the space and around said plurality of power semiconductor elements, the second sealing material encloses an outer circumferential part of the first sealing material surrounding said plurality of power semiconductor elements to directly cover side portions of the first sealing material and indirectly cover an upper portion of the first sealing material through the printed circuit board, the first sealing material contains no flame retardant to enhance a thermal resistant performance, and the second sealing material contains the flame retardant to resist oxidation degradation, and the first sealing material encloses the external connection terminal between the copper base substrate and the printed circuit board, wherein said plurality of power semiconductor modules is arranged side by side in the case, the printed circuit boards of the plurality of power semiconductors are integrally connected to each other, and the second sealing material is arranged in the case between the plurality of power semiconductor modules, and wherein a heat distortion temperature of each of the first sealing materials is 175° C. to 225° C., a thermal expansion coefficient of each of the first sealing materials is $1.5 \times 10^{-5}/°$ C. to $1.8 \times 10^{-5}/°$ C., and a bonding strength of each of the first sealing materials to each of the copper base substrates is 10 MPa to 30 MPa; a heat distortion temperature of each of the second sealing materials is 100° C. to 175° C., a thermal expansion coefficient of each of the second sealing materials is $1.5 \times 10^{-5}/°$ C. to $1.8 \times 10^{-5}/°$ C., and a bonding strength of each of the second sealing materials to each of the copper base substrates is 10 MPa to 30 MPa; and liquid epoxy resin is used in the first sealing materials and the second sealing materials.

* * * * *

UNITED STATES PATENT AND TRADEMARK OFFICE
CERTIFICATE OF CORRECTION

PATENT NO. : 9,287,187 B2  
APPLICATION NO. : 14/125019  
DATED : March 15, 2016  
INVENTOR(S) : Katsuhiko Yanagawa et al.

Page 1 of 1

It is certified that error appears in the above-identified patent and that said Letters Patent is hereby corrected as shown below:

Specification

Column 1, Line 39-40

Please delete "A predetermined amount of silicone sealing material layer 30."

Signed and Sealed this  
Fourteenth Day of June, 2016

Michelle K. Lee  
*Director of the United States Patent and Trademark Office*